United States Patent
Huang et al.

(10) Patent No.: US 9,666,529 B2
(45) Date of Patent: *May 30, 2017

(54) METHOD AND STRUCTURE TO REDUCE THE ELECTRIC FIELD IN SEMICONDUCTOR WIRING INTERCONNECTS

(71) Applicant: International Business Machines Corporation, Armonk, NY (US)

(72) Inventors: Elbert Emin Huang, Carmel, NY (US); Takeshi Nogami, Schenectady, NY (US); Raghuveer R. Patlolla, Albany, NY (US); Christopher J. Penny, Poughkeepsie, NY (US); Theodorus Eduardus Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/883,972

(22) Filed: Oct. 15, 2015

(65) Prior Publication Data
US 2016/0064330 A1   Mar. 3, 2016

Related U.S. Application Data

(62) Division of application No. 14/474,935, filed on Sep. 2, 2014, now Pat. No. 9,379,057.

(51) Int. Cl.
*H01L 23/528* (2006.01)
*H01L 21/768* (2006.01)
(Continued)

(52) U.S. Cl.
CPC ........ *H01L 23/528* (2013.01); *H01L 21/7684* (2013.01); *H01L 21/76804* (2013.01);
(Continued)

(58) Field of Classification Search
CPC .................. H01L 21/76829; H01L 23/528
See application file for complete search history.

(56) References Cited

U.S. PATENT DOCUMENTS 5,891,513 A   4/1999   Dubin et al.
6,057,581 A   5/2000   Doan
(Continued)

OTHER PUBLICATIONS

Anonymous; Bi-directionally Self Aligned Vias; IP.com No. IPCOM000231097D: Sep. 26, 2013.
(Continued)

*Primary Examiner* — Jarrett Stark
*Assistant Examiner* — Charles N Ausar-El
(74) *Attorney, Agent, or Firm* — Steven J. Meyers; Howard M. Cohn

(57) ABSTRACT

Embodiments of the present invention provide increased distance between vias and neighboring metal lines in a back end of line (BEOL) structure. A copper alloy seed layer is deposited in trenches that are formed in a dielectric layer. The trenches are then filled with copper. An anneal is then performed to create a self-forming barrier using a seed layer constituent, such as manganese, as the manganese is drawn to the dielectric layer during the anneal. The self-forming barrier is disposed on a shoulder region of the dielectric layer, increasing the effective distance between the via and its neighboring metal lines.

11 Claims, 10 Drawing Sheets

(51) Int. Cl.
*H01L 23/525* (2006.01)
*H01L 23/532* (2006.01)
*H01L 23/522* (2006.01)

(52) U.S. Cl.
CPC .. *H01L 21/76807* (2013.01); *H01L 21/76829* (2013.01); *H01L 21/76831* (2013.01); *H01L 21/76843* (2013.01); *H01L 21/76849* (2013.01); *H01L 21/76855* (2013.01); *H01L 21/76864* (2013.01); *H01L 21/76883* (2013.01); *H01L 23/5226* (2013.01); *H01L 23/53228* (2013.01); *H01L 23/53238* (2013.01); *H01L 23/53295* (2013.01); *H01L 21/76832* (2013.01); *H01L 2924/0002* (2013.01)

(56) References Cited

U.S. PATENT DOCUMENTS

| | | | |
|---|---|---|---|
| 6,143,645 A | 11/2000 | Hsu et al. | |
| 6,573,551 B1 | 6/2003 | Kim et al. | |
| 7,071,099 B1* | 7/2006 | Greco | H01L 21/76807 257/752 |
| 7,086,138 B2 | 8/2006 | Anderson | |
| 7,514,361 B2 | 4/2009 | Bonilla et al. | |
| 7,544,609 B2* | 6/2009 | Angyal | H01L 21/7684 257/E21.584 |
| 7,727,888 B2 | 6/2010 | Yang et al. | |
| 7,745,282 B2 | 6/2010 | Yang et al. | |
| 8,039,966 B2 | 10/2011 | Yang et al. | |
| 8,138,604 B2 | 3/2012 | Yang et al. | |
| 8,299,625 B2 | 10/2012 | Ponoth et al. | |
| 8,361,900 B2 | 1/2013 | Pan et al. | |
| 8,492,897 B2* | 7/2013 | Cabral, Jr. | H01L 23/53238 257/751 |
| 8,716,134 B2* | 5/2014 | Edelstein | H01L 21/4814 257/751 |
| 9,190,321 B2* | 11/2015 | Cabral, Jr. | H01L 21/76846 |
| 2001/0001717 A1 | 5/2001 | Kumauchi et al. | |
| 2002/0121699 A1 | 9/2002 | Cheng et al. | |
| 2008/0179747 A1* | 7/2008 | Sakai | H01L 21/76805 257/751 |
| 2009/0035588 A1* | 2/2009 | Li | H01L 23/5226 428/457 |
| 2010/0038789 A1* | 2/2010 | Cheng | H01L 21/28556 257/753 |
| 2010/0207177 A1 | 8/2010 | Liu et al. | |
| 2011/0006429 A1* | 1/2011 | Liu | H01L 21/76831 257/751 |
| 2011/0101529 A1* | 5/2011 | Kao | H01L 23/53238 257/751 |
| 2011/0266676 A1* | 11/2011 | Isobayashi | H01L 21/76831 257/751 |
| 2013/0307150 A1* | 11/2013 | Edelstein | H01L 23/53238 257/741 |
| 2014/0021615 A1* | 1/2014 | Ryan | H01L 23/53209 257/751 |
| 2014/0065815 A1* | 3/2014 | Tanwar | H01L 21/76832 438/627 |
| 2014/0097538 A1* | 4/2014 | Zhao | H01L 23/53238 257/751 |
| 2014/0117547 A1* | 5/2014 | Lin | H01L 23/53233 257/751 |
| 2014/0217591 A1* | 8/2014 | Ryan | H01L 23/53238 257/751 |
| 2014/0264874 A1* | 9/2014 | Sung | H01L 23/5329 257/751 |

OTHER PUBLICATIONS

Narasimha, S. et al; 22nm High-Performance SOI Technology Featuring Dual-Embedded Stressors, Epi-Plate High-K Deep-Trench Embedded DRAM and Self-Aligned Via 15LM BEOL; IEEE; 2012; IEDM12, 52-55.

Xia, F. et al; Characterization and Challenge of TDDB Reliability in Cu/Low K Dielectric Interconnect; IEEE; 2011; IRPS11, 61-64.

Koike, J. et al; Cu Alloy Metallization for Self-Forming Barrier Process; IEEE; 2006; pp. 161-163.

Ohoka, Y. et al; Integration of Self-Formed Barrier Technology for 32nm-node Cu Dual-Damascene Interconnects with Hybrid Low-k (PAr/SiOC) Structure; 2006 Symposium on VLSI Technology Digest of Technical Papers; IEEE 2006.

Usui, T. et al; Highly Reliable Copper Dual-Damascene Interconnects With Self-Formed MnSixOy Barrier Layer; IEEE Transactions on Electron Devices, vol. 53, No. 10, Oct. 2006; pp. 2492-2499.

\* cited by examiner

METHOD AND STRUCTURE TO REDUCE THE ELECTRIC FIELD IN SEMICONDUCTOR WIRING INTERCONNECTS

CROSS REFERENCE TO RELATED APPLICATIONS

This application is a division of commonly-owned, copending U.S. patent application Ser. No. 14/474,935 entitled METHOD AND STRUCTURE TO REDUCE THE ELECTRIC FIELD IN SEMICONDUCTOR WIRING INTERCONNECTS, and filed on Sep. 2, 2014.

FIELD OF THE INVENTION

The present invention relates generally to semiconductor fabrication, and more particularly, to back-end-of-line (BEOL) structures and methods of formation.

BACKGROUND OF THE INVENTION

In modern integrated circuits (ICs), high levels of functionality are achieved on a single chip by integrating large numbers of devices. One process commonly employed in achieving high circuit densities is by using back-end-of-line (BEOL) interconnect structures to link numerous devices, thereby forming a complex integrated circuit. BEOL interconnect structures are often fabricated by damascene processes, such as a dual damascene process in which a dielectric layer is deposited, vias and trenches are etched in the dielectric layer, and the vias and trenches are filled with a conductor using a single blanket deposition followed by planarization. This process is replicated to stack different conductive and via levels to create a multi-level, high density framework of conductive interconnections. As feature sizes continue to shrink with advances in technology, the dimensions of the interconnect structure spacing and thicknesses of the dielectric layers are correspondingly reduced. Reduced spacing between interconnect structures creates the potential for various issues, such as dielectric breakdown. It is therefore desirable to have improved BEOL interconnect structures and methods for fabricating BEOL interconnect structures to mitigate the aforementioned issues.

SUMMARY OF THE INVENTION

In a first aspect, embodiments of the present invention provide a method of forming a semiconductor structure, comprising: forming a plurality of M(x) trenches in a first dielectric layer thereby creating a shoulder region on a top surface of the first dielectric layer; forming a manganese copper alloy seed layer on the first dielectric layer; filling the plurality of M(x) trenches with copper to form a plurality of M(x) copper regions; annealing the plurality of M(x) copper regions to form a manganese silicate liner between the first dielectric layer and the M(x) copper regions; recessing the plurality of M(x) copper regions to a level below a top surface of the first dielectric layer, thereby leaving the manganese silicate liner on the top surface of the first dielectric layer and forming a plurality recessed M(x) copper regions; forming a blanket capping layer over the manganese silicate liner on the top surface of the first dielectric layer and the plurality of recessed M(x) copper regions; forming a second dielectric layer over the blanket capping layer; forming an opening in the second dielectric layer and the blanket capping layer to expose one of the plurality of M(x) copper regions and an adjacent portion of the manganese silicate liner on the top surface of the first dielectric layer; and filling the opening in the second dielectric layer with metallurgy to form a via, wherein the via has a non-planar bottom surface comprising a lower portion and an upper portion, wherein the lower portion of the non-planar bottom surface of the via in electrical contact with the one of the plurality of M(x) copper regions previously exposed, and wherein an upper portion of the non-planar bottom surface of the via is in contact with the manganese silicate liner on the first dielectric layer. In a second aspect, embodiments of the present invention provide a semiconductor structure comprising: an M(x) copper region in a dielectric layer, wherein a shoulder region of the dielectric layer are adjacent to, and above each of the M(x) copper regions; a barrier layer disposed on the shoulder region, a sidewall of the M(x) copper region, and an underside of the M(x) copper region; a via in electrical contact with the first M(x) copper region, wherein the via has a non-planar bottom surface; and a via barrier layer disposed on sidewalls of the via.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
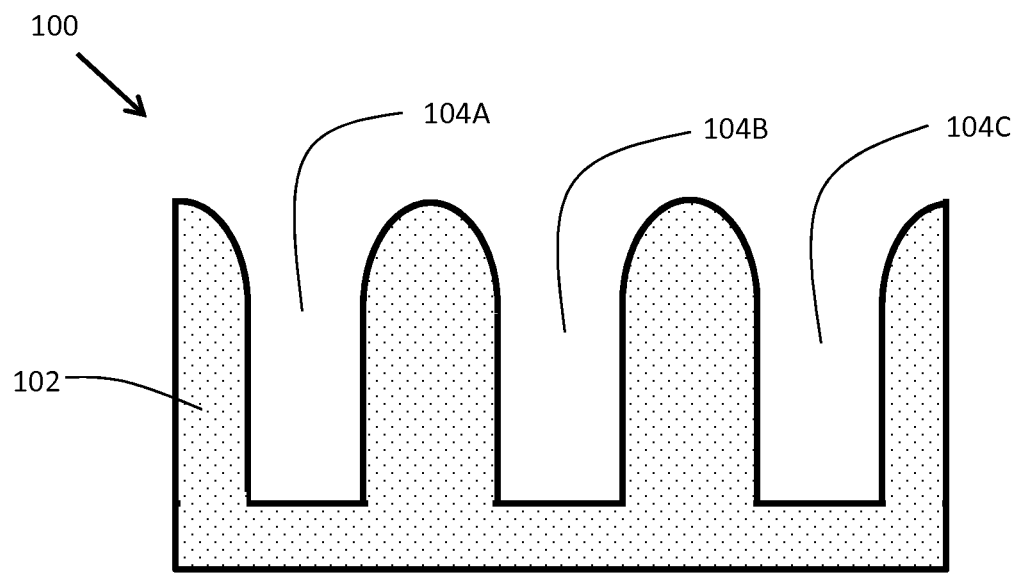

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1A is a semiconductor structure at a starting point for embodiments of the present invention.

Figure 1B:
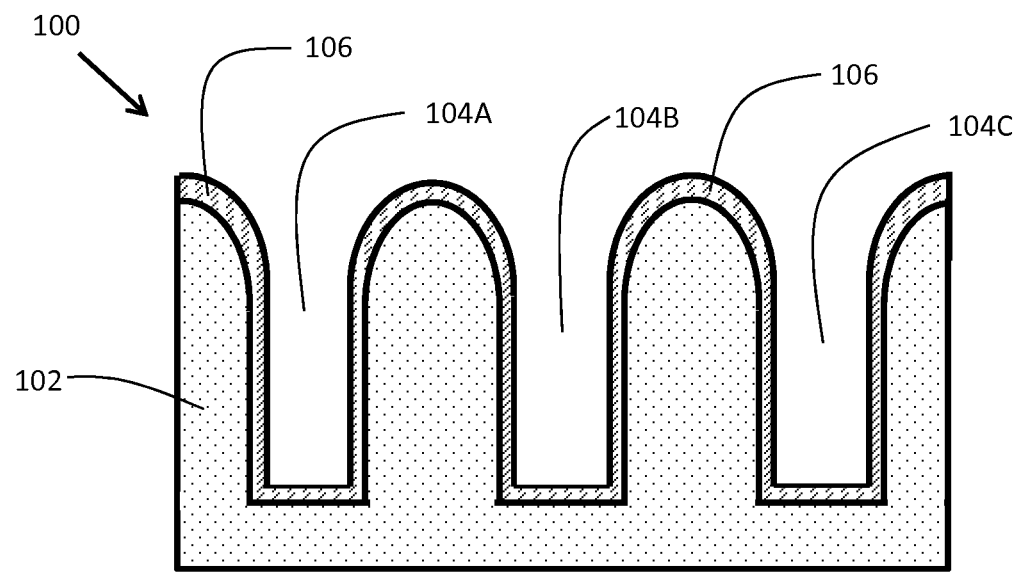

FIG. 1B is a semiconductor structure after a subsequent process step of depositing a seed layer.

Figure 1C:
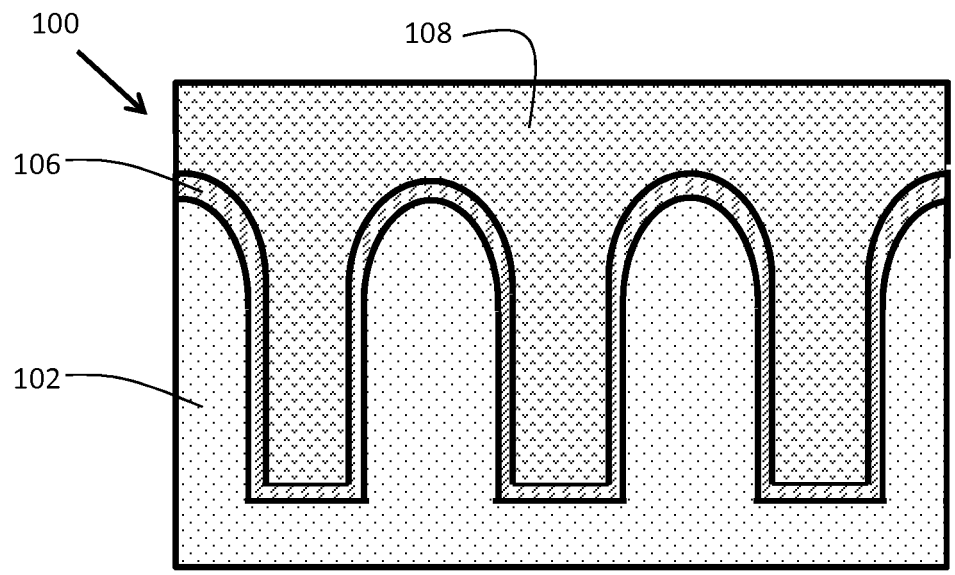

FIG. 1C is a semiconductor structure after a subsequent process step of depositing a copper layer.

Figure 1D:
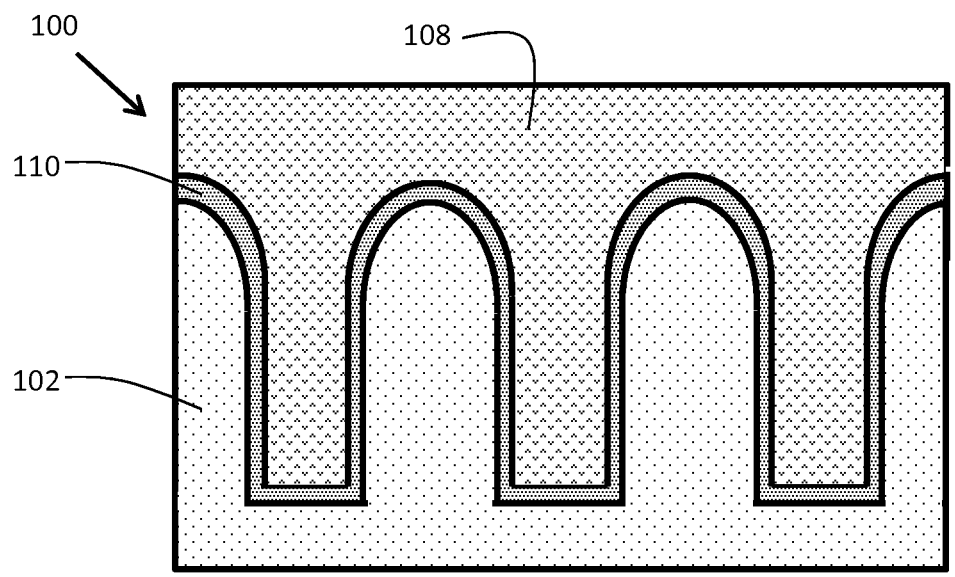

FIG. 1D is a semiconductor structure after a subsequent process step of performing an anneal to form a barrier layer.

Figure 1E:
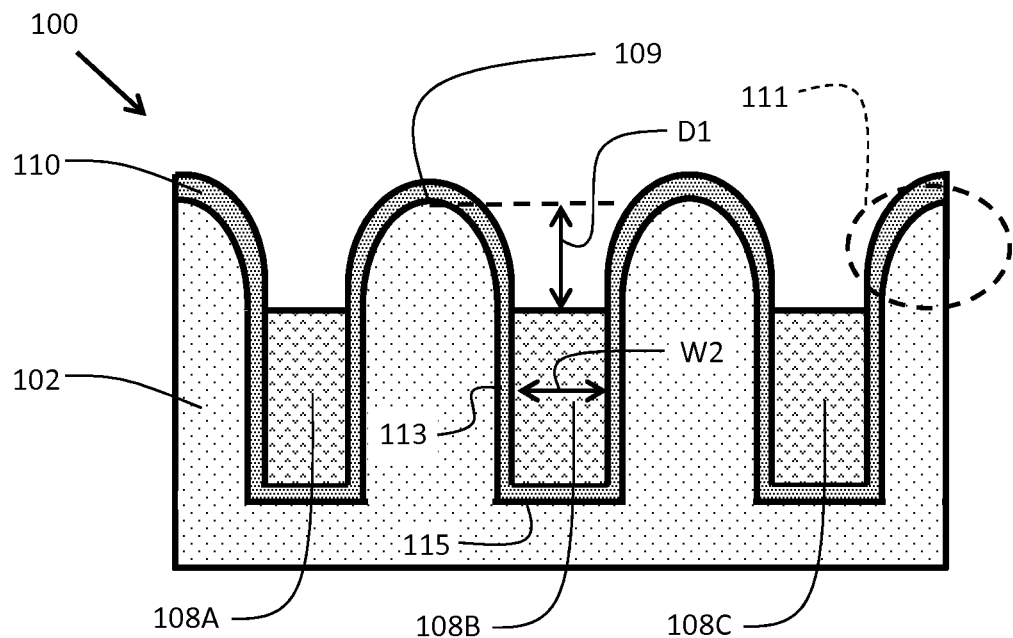

FIG. 1E is a semiconductor structure after a subsequent process step of performing a recess of the copper material.

Figure 1F:
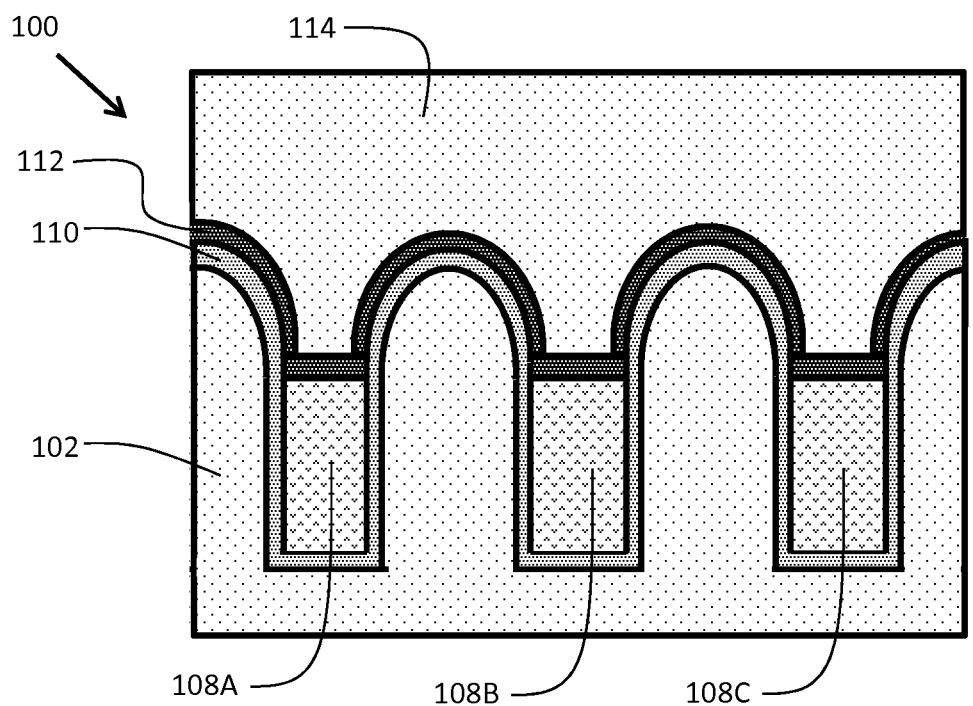

FIG. 1F is a semiconductor structure after a subsequent process step of depositing a blanket capping layer and an additional dielectric layer.

Figure 1G:
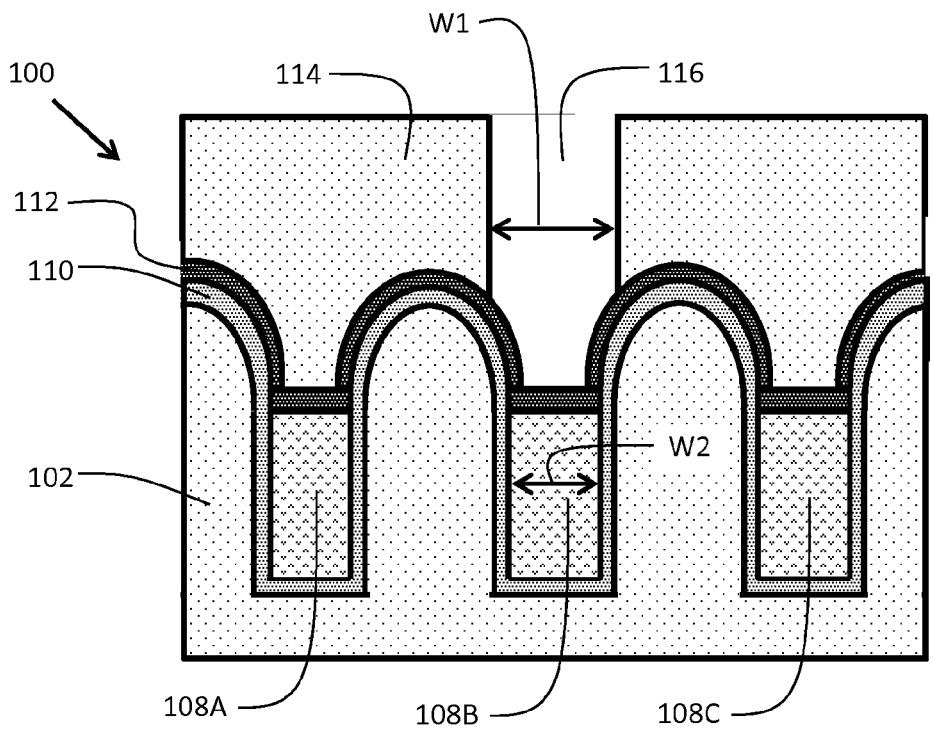

FIG. 1G is a semiconductor structure after a subsequent process step of forming a via cavity.

Figure 1H:
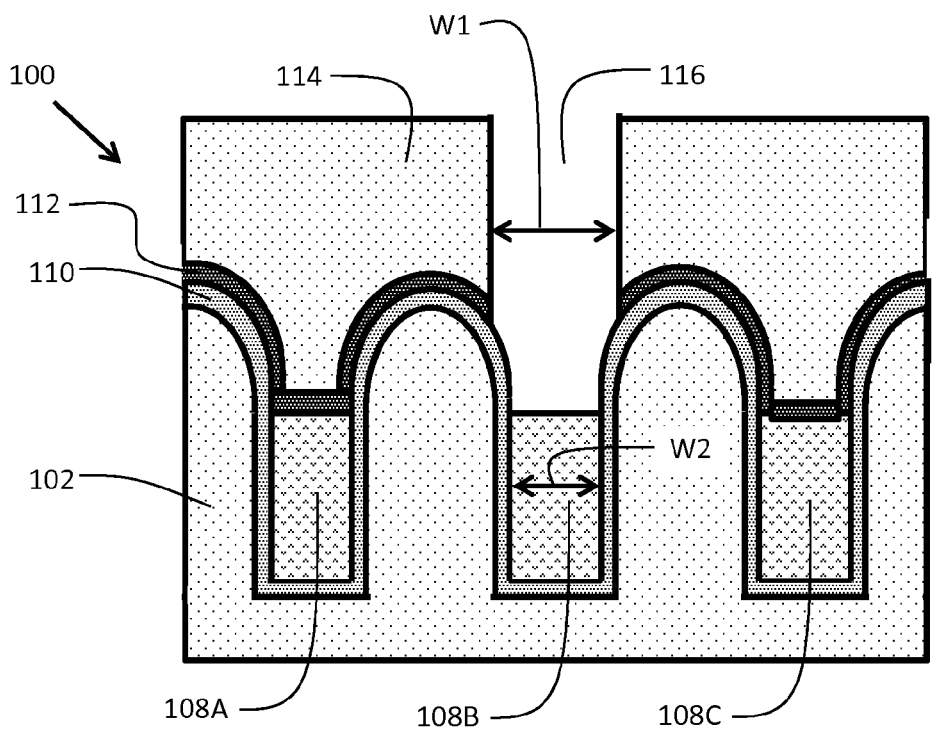

FIG. 1H is a semiconductor structure after a subsequent process step of opening an M(x) copper region.

Figure 1I:
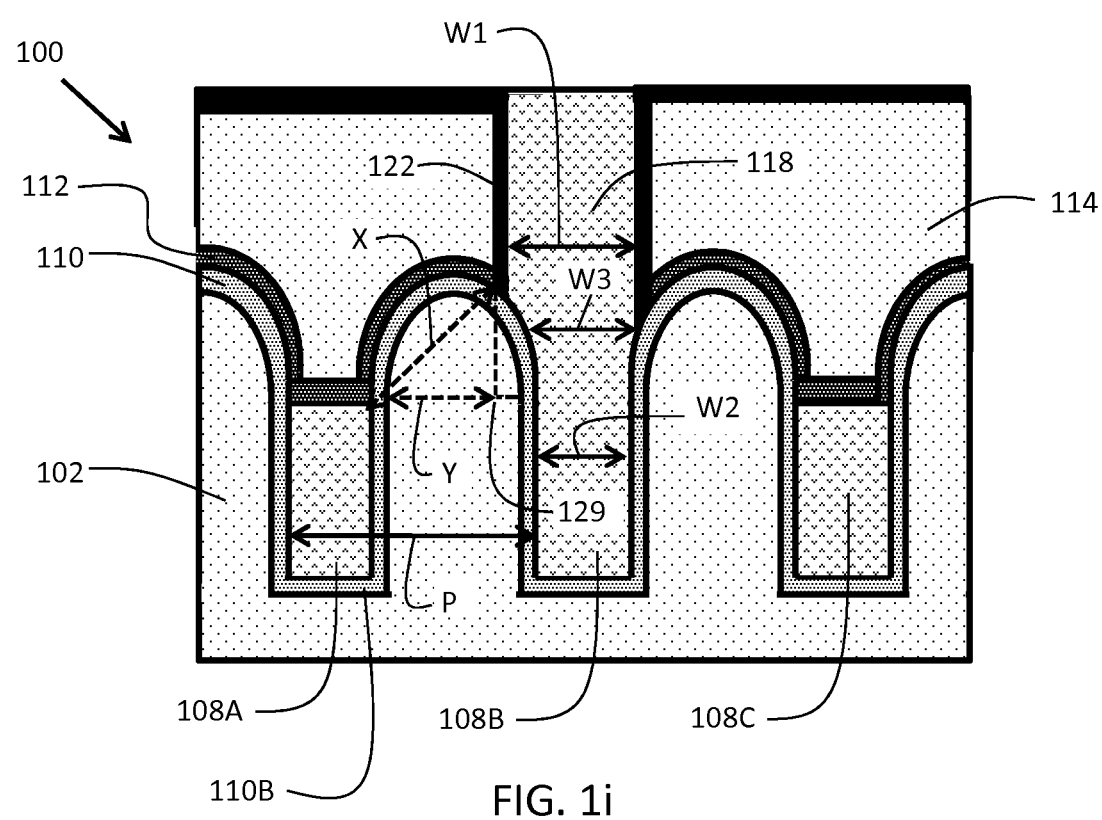

FIG. 1i is a semiconductor structure after a subsequent process step of forming a via.

Figure 1J:
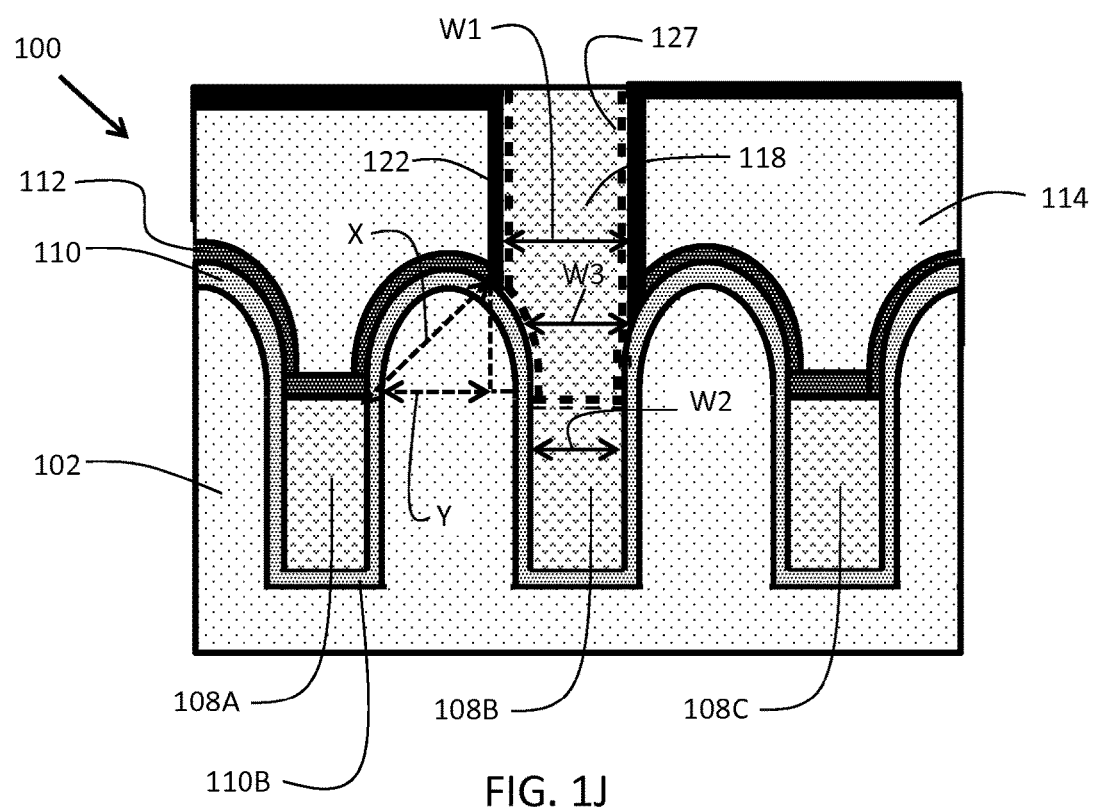

FIG. 1J is a semiconductor structure in accordance with alternative embodiments after a subsequent process step of forming a via.

Figure 2A:
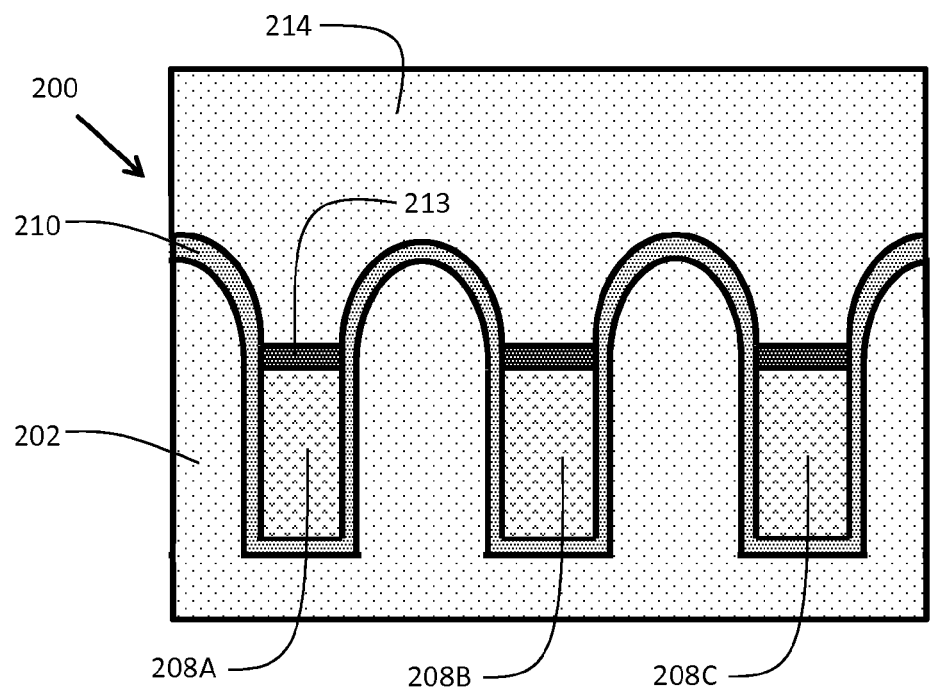

FIG. 2A is a semiconductor structure in accordance with an alternative embodiment of the present invention, following from FIG. 1E, after a subsequent process step of depositing a copper-selective capping layer and an additional dielectric layer.

Figure 2B:
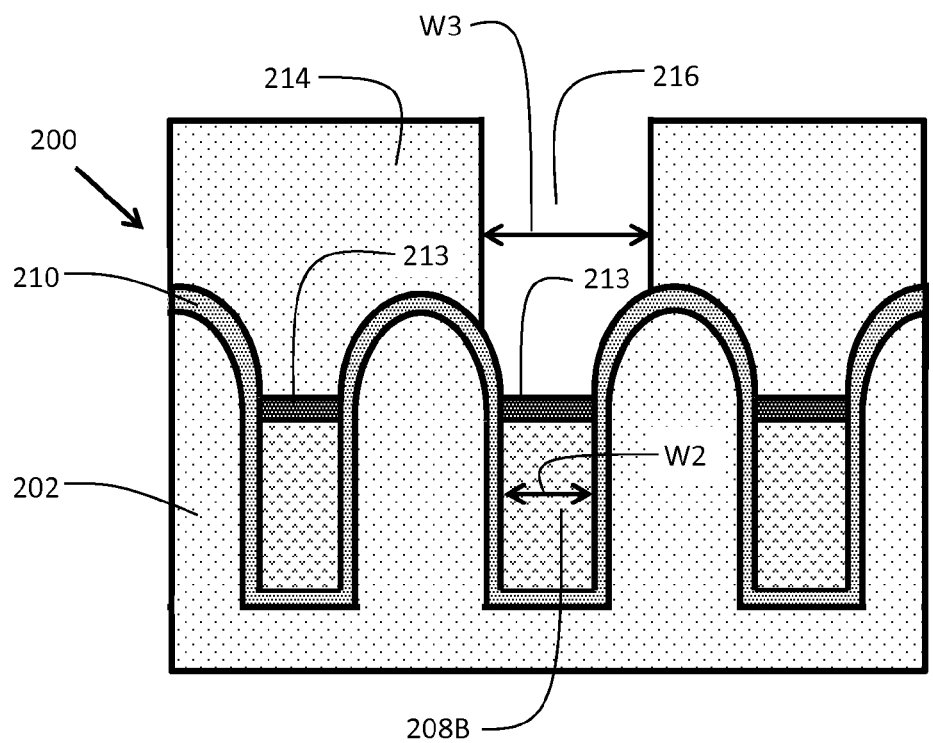

FIG. 2B is a semiconductor structure after a subsequent process step of forming a via cavity.

Figure 2C:
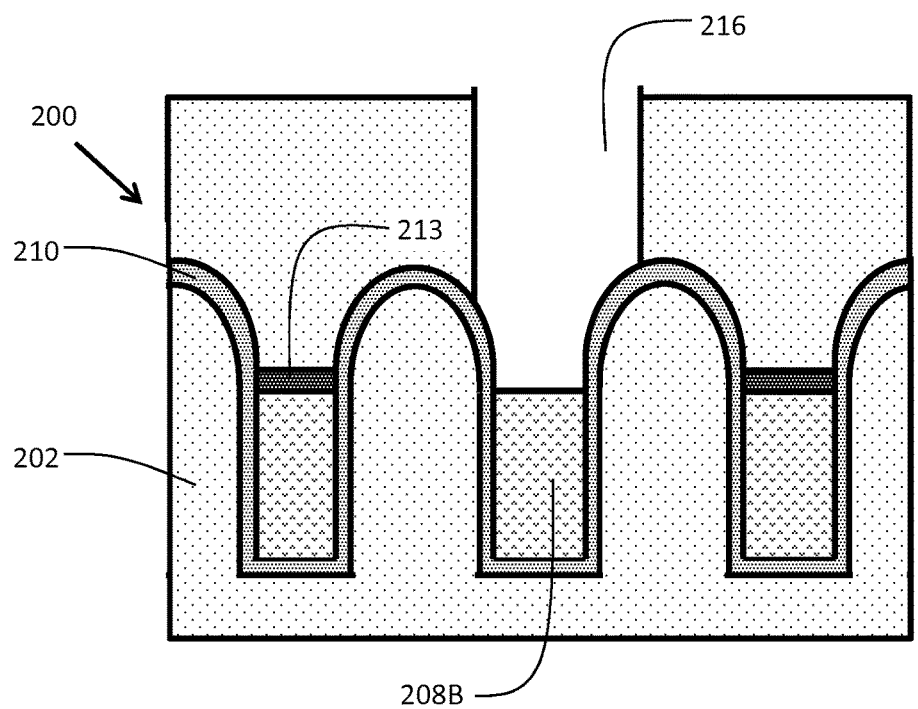

FIG. 2C is a semiconductor structure after a subsequent process step of opening an M(x) copper region.

Figure 2D:
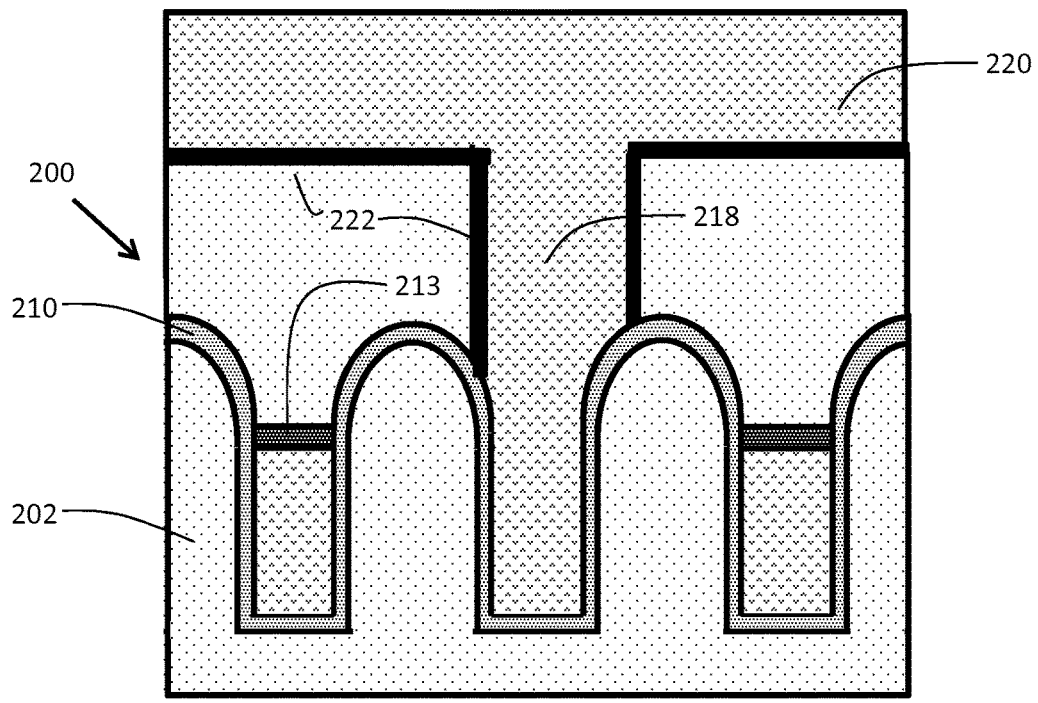

FIG. 2D is a semiconductor structure after a subsequent process step of forming a via.

Figure 3:
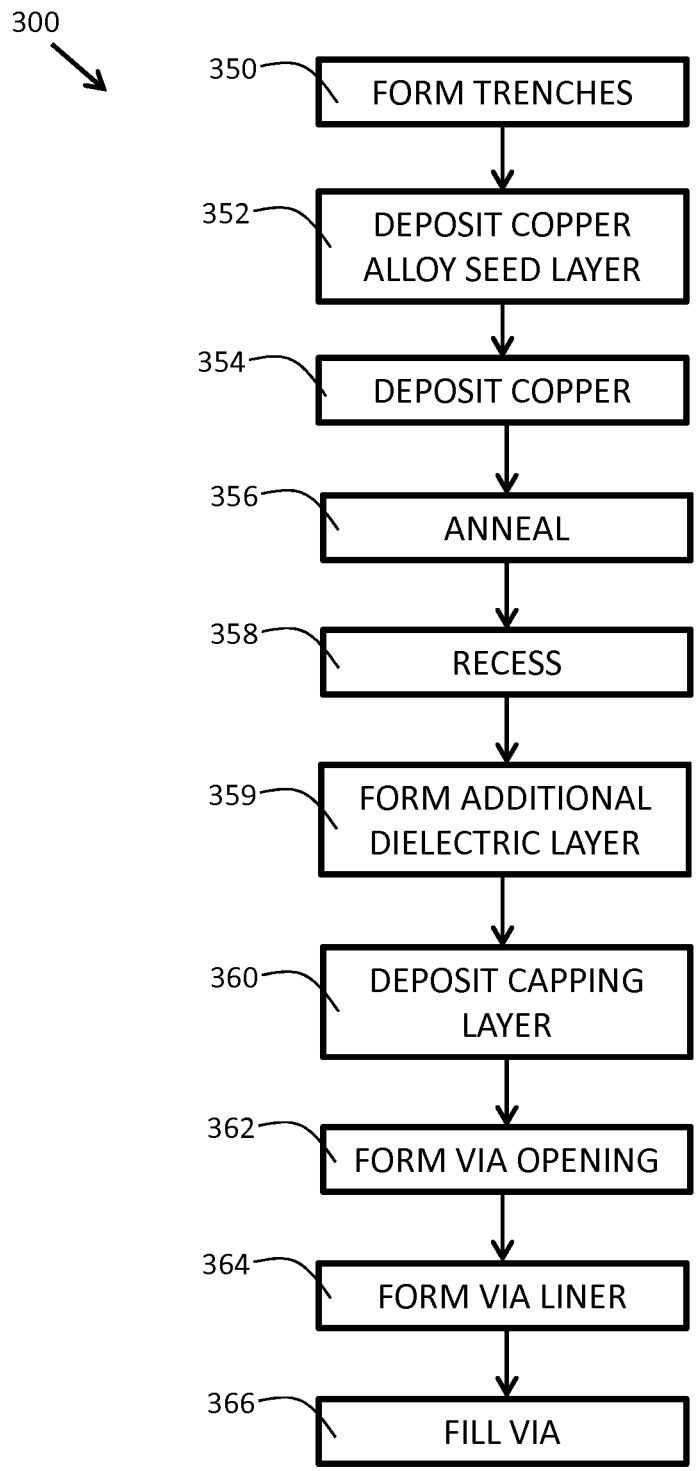

FIG. 3 is a flowchart indicating process steps for embodiments of the present invention.

Figure 4:
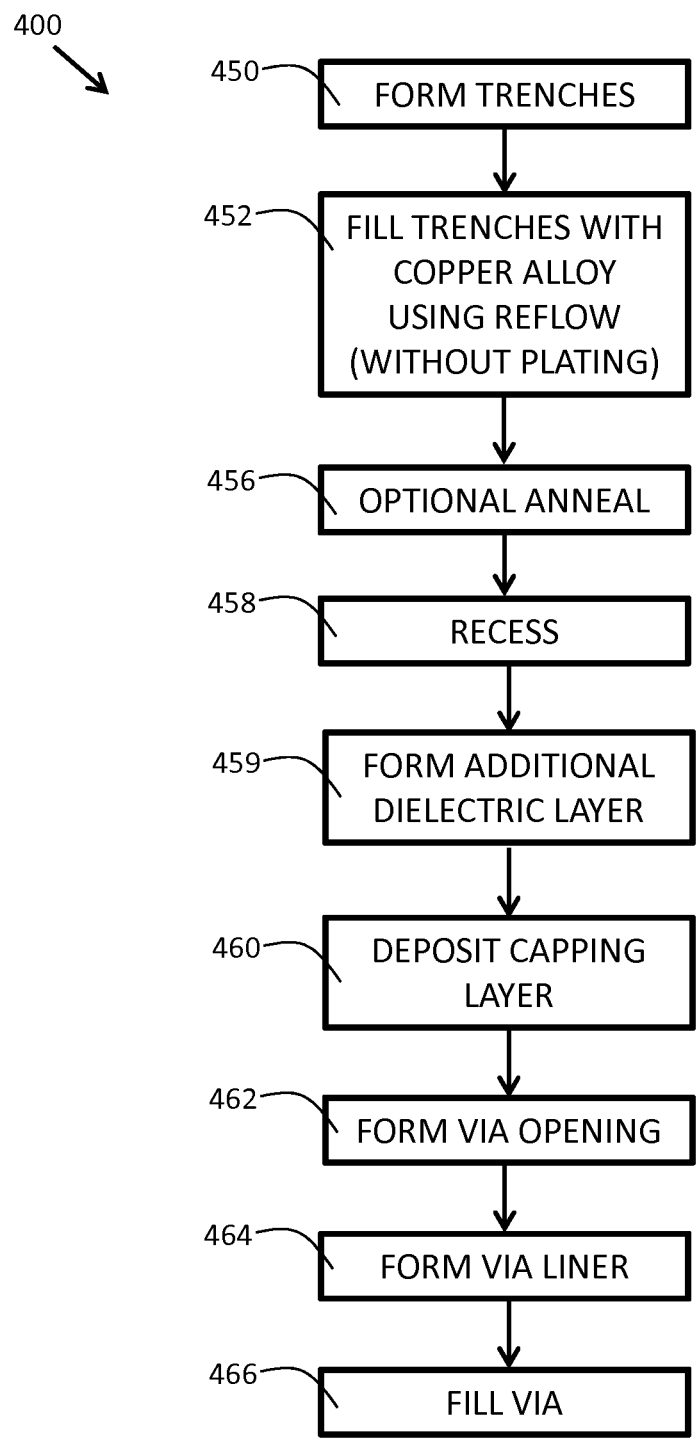

FIG. 4 is a flowchart indicating process steps for alternative embodiments of the present invention.

DETAILED DESCRIPTION

Embodiments of the present invention provide increased distance between vias and neighboring metal lines in a back end of line (BEOL) structure. A copper alloy seed layer is deposited in trenches that are formed in a dielectric layer. The trenches are then filled with copper. An anneal is then performed to create a self-forming barrier using a seed layer constituent, such as manganese, as the manganese is drawn to the dielectric layer during the anneal. The self-forming barrier is disposed on a shoulder region of the dielectric layer, increasing the effective distance between the via and its neighboring metal lines.

FIG. 1A is a semiconductor structure 100 at a starting point for embodiments of the present invention. A dielectric layer 102 has a plurality of trenches 104A, 104B, and 104C formed therein. The dielectric layer may be an interlayer dielectric (ILD), and may be comprised of silicon oxide, or other suitable material. The dielectric layer 102 may be part of a BEOL stack that may include multiple metal and via layers. In this disclosure, the term "M(x)" denotes a generic metal level, while the term "M(x+1)" denotes a metal level that is one level above metal level M(x). In embodiments, there may be 10 or more metal levels in an integrated circuit, with via levels connecting the adjacent metal levels. In subsequent process steps, metallization lines for metal level M(x) will be formed in the trenches 104A-104C.

FIG. 1B is semiconductor structure 100 after a subsequent process step of depositing a copper alloy seed layer 106. In embodiments, the seed layer may be deposited using a physical vapor deposition (PVD) process. The seed layer 106 serves multiple purposes. It provides adhesion for a subsequent copper fill process. Additionally, the copper alloy serves to provide a self-forming barrier after an anneal process. In embodiments, the seed layer 106 is a copper manganese alloy (CuMn). In other embodiments, the seed layer 106 may comprise other materials to create a self-forming barrier. The other materials included in seed layer 106 may include, but are not limited to, aluminum, germanium, magnesium, nickel, and titanium. Thus, in embodiments, the seed layer 106 may include CuAl, CuGe, CuMg, CuNi, or CuTi. In some embodiments, a conformal film may be deposited by chemical vapor deposition (CVD) prior to the seed layer. In embodiments, the conformal film is comprised of ruthenium or cobalt.

FIG. 1C is semiconductor structure 100 after a subsequent process step of depositing a copper layer 108. The copper layer 108 may be deposited using an electroplating process or other suitable technique. The copper layer 108 adheres to copper alloy seed layer 106 during the electroplating process.

FIG. 1D is semiconductor structure 100 after a subsequent process step of performing an anneal to form a barrier layer 110. In embodiments that utilize a CuMn seed layer 106, the resulting barrier layer may be manganese silicate ($MnSiO_3$). In embodiments, the anneal may be performed at a process temperature ranging from about 100 degrees Celsius to about 450 degrees Celsius for a duration ranging from about 1 minute to about 60 minutes. This anneal is engineered to drive dopants to the dielectric interface.

FIG. 1E is semiconductor structure 100 after a subsequent process step of performing a recess of the copper material to form copper regions 108A, 108B, and 108C. In embodiments, the recess may be performed using a chemical mechanical polish (CMP) process, by adjusting the parameters of the CMP tool to intentionally achieve an over-polish condition. Additionally, a wet etch process may be used to further etch the copper regions. The wet etch may include an SC-1 (ammonium hydroxide and/or hydrogen peroxide) etchant. In another embodiment, the wet etch process may comprise an alanine wet etch. The copper regions 108A-108C are recessed to a depth D1 below the top surface 109 of the dielectric region 102. In embodiments, D1, may range from approximately one third of the trench width W2 to roughly the same distance as W2. In embodiments, D1 ranges from about 10 nanometers to about 30 nanometers below the top surface 109 of the dielectric layer 102. If D1 is too small, the separation between the landing via and the adjacent line below is reduced. That in turn creates the need to significantly tighten the overlay tolerances, and adversely impacts the product yield. If D1 is too large, it places a burden on the yield of the landing vias. This is because the anisotropic etching (e.g. using RIE) of the vias typically becomes more difficult as it has to traverse longer vertical distances. One advantage of embodiments of the present invention is that the via opening can be larger than the line width, which helps the via cavity formation process. The self-forming barrier 110 is disposed on a shoulder region (indicated generally as 111) of the dielectric layer 102. The shoulder regions 111 are disposed above and between each of the copper regions 108A, 108B, and 108C. Copper regions 108A, 108B, and 108C are M(x) copper regions. The barrier layer 110 is disposed on the shoulder region 111, sidewall portions 113 of each M(x) copper region, and underside 115 of each M(x) copper region.

FIG. 1F is semiconductor structure 100 after a subsequent process step of depositing a blanket capping layer 112 and then depositing an additional dielectric layer 114. In embodiments, dielectric layer 114 may be comprised of the same material as dielectric layer 102. In other embodiments, dielectric layer 114 may be of a different material than dielectric layer 102. In embodiments, capping layer 112 is comprised of at least two of silicon, nitrogen and carbon, and may include silicon nitride (SiN). In other embodiments, capping layer 112 is comprised of silicon carbon nitride (SiCN), silicon oxynitride SiON, or other suitable material. In embodiments, the capping layer 112 is deposited using a chemical vapor deposition (CVD) process or plasma-enhanced chemical vapor deposition (PECVD) process.

FIG. 1G is semiconductor structure 100 after a subsequent process step of forming a via cavity. This may be accomplished by patterning a hardmask layer (not shown) utilizing industry-standard lithographic and patterning techniques, followed by an anisotropic etch to form via cavity 116. In embodiments, the anisotropic etch is performed using a reactive ion etch (RIE) process. The via cavity has a width W1, while the copper region 108B has a width W2. In embodiments, width W1 is greater than width W2. In embodiments, width W2 ranges from about 20 nanometers to about 40 nanometers, and width W1 is about 10 percent to about 20 percent larger than width W2. The larger width W1 makes the via cavity 116 that is above copper region 108B less sensitive to overlay errors, and also can serve to relax the lithographic requirements for making the via cavity 116.

FIG. 1H is semiconductor structure 100 after a subsequent process step of opening an M(x) copper region 108B. Copper region 108B represents a metallization line at metal level M(x). After subsequent process steps, via cavity 116 will hold a via that connects copper region 108B to a metallization line at level M(x+1). The opening of copper region 108B may be accomplished by utilizing a selective etch process to remove the capping layer 112 that is exposed in via cavity 116. For example, if capping layer 112 is comprised of silicon nitride, and dielectric layer 114 is comprised of silicon oxide, then there are a variety of known etch techniques for selectively removing the capping layer 112, while preserving the dielectric layer 112, and the barrier layer 110. The barrier layer 110 may serve as an etch stopping layer during the formation of via cavity 116.

FIG. 1i is semiconductor structure 100 after a subsequent process step of forming a via 118. The via cavity 116 (FIG. 1H) is filled with metallurgy, which may include copper. The bottom of the via is in contact with the shoulder regions of dielectric (see 111 of FIG. 1E), thus forming a non-planar bottom of the via. First, a via barrier layer 122 is formed on the sidewalls of the via cavity 116, as well as the top of dielectric layer 114. The via barrier layer 122 serves to prevent diffusion of copper into the dielectric layer 114. In embodiments, the via barrier layer 122 is comprised of MnSiO3.

Further illustrated in FIG. 1i is the shoulder separation distance X, which represents the distance from the nearest corner of an adjacent M(x) metal region to where shoulder/sidewall meeting point of the via 118. In embodiments, the dimension X ranges from about 0.35 times the metal region pitch P to about 0.7 times the metal region pitch P. In some embodiments, the pitch P may be approximately twice the metal width W2. In comparison, without the benefits of embodiments of the present invention, the via 118 would extend through the shoulder to point 129, resulting in a via separation distance Y, where Y<X. Thus, embodiments of the present invention create a greater separation between M(x) metal regions and adjacent overlying vias. The greater separation results in a decreased electric field, which allows for the same voltages to be used at reduced dimensions, and serves to reduce the probability of time-dependent dielectric breakdown (TDDB).

Continuing with FIG. 1i, the via has a body which is adjacent dielectric 114 and a via bottom along 112 and the underlying copper region 108B. It can be seen that via 118 may have bottom which is non-planar. As a result, the bottom of the via may have two widths. It may have a first width W3 in an upper portion of the non-planar bottom of the via, and a second width in a lower portion of the non-planar bottom of the via where it meets the copper region 108B. Accordingly, the lower width of the bottom of the via will most likely equal the width of underlying trench, W2. Thus, the width W3 in the upper portion of the via bottom may be greater than (wider than) the via bottom at the lower portion of the via bottom. The width of the via cavity, W1, may be greater than or equal to the width W3 of the upper portion of the non-planar via bottom.

FIG. 1J shows another embodiment in which an additional liner 127 which may be comprised of ruthenium or cobalt may be deposited using a chemical vapor deposition process, prior to the deposition of barrier layer 122. In such a case, manganese from a CuMn seed layer diffuses through the cobalt or ruthenium film to form the barrier layer 122 (e.g. MnSiO3) at the dielectric interface. The additional liner 127 may be in direct contact with the M(x) copper region 108B and the via 118. In other embodiments, not shown. The barrier layer may comprise Ta and/or TaN. It will form on the sidewalls of the via opening and on top of the underlying copper region 108B so as to contact a portion of the copper region 108B. In this embodiment, an additional liner 127 comprising ruthenium or cobalt or manganese may be formed on the Ta containing barrier layer 122.

FIG. 2A is a semiconductor structure 200 in accordance with an alternative embodiment of the present invention, following from FIG. 1E, after a subsequent process step of depositing a copper-selective capping layer and an additional dielectric layer. As stated previously, similar elements may be referred to by similar numbers in various figures (FIGs) of the drawing, in which case typically the last two significant digits may be the same. For example, dielectric layer 202 of FIG. 2 is similar to dielectric layer 102 of FIG. 1. With semiconductor structure 200, instead of using a blanket capping layer such as 112 of FIG. 1F, a copper-selective capping layer 213 is deposited. The copper-selective capping layer 213 does not deposit on the barrier layer 210 that is disposed on dielectric layer 202. In embodiments, the barrier layer 210 is comprised of MnSiO3 that self-forms during an anneal. Thus, the copper-selective deposition process deposits capping layer 213 only on the metal lines 208A, 208B, and 208C. In embodiments, the copper-selective capping layer is comprised of cobalt. In other embodiments, the copper-selective capping layer is comprised of cobalt tungsten phosphorus (CoWP). In other embodiments, the copper-selective capping layer is comprised of ruthenium and/or nickel.

FIG. 2B is semiconductor structure 200 after a subsequent process step of forming a via cavity 216. This may be accomplished by patterning a hardmask layer (not shown) utilizing industry-standard lithographic and patterning techniques, followed by an anisotropic etch to form via cavity 216. In embodiments, the anisotropic etch is performed using a reactive ion etch (RIE) process. The via cavity has a width W3, while the copper region 208B has a width W2. In embodiments, width W3 is greater than width W2. In embodiments, width W3 ranges from about 20 nanometers to about 40 nanometers, and width W3 is about 10 percent to about 20 percent larger than width W2. As shown, via cavity 216 is off-center from copper region 208B, illustrating the effects of an overlay error. The larger width W3 makes the via cavity less sensitive to overlay errors, and also can serve to relax the lithographic requirements for making the via cavity 216. Thus, even if the via cavity 216 is off center with respect to the copper region 208B, the via still fully contacts the metal wiring below.

FIG. 2C is semiconductor structure 200 after a subsequent process step of opening an M(x) copper region 208B. Copper region 208B represents a metallization line at metal level M(x). After subsequent process steps, via cavity 216 will hold a via that connects copper region 208B to a metallization line at level M(x+1). The opening of copper region 208B may be accomplished by utilizing a selective etch process to remove the capping layer 213 that is exposed in via cavity 216.

FIG. 2D is semiconductor structure 200 after a subsequent process step of forming a via 218. First, a via barrier layer 222 is formed on the sidewalls of the via cavity 216. The via barrier layer 222 serves to prevent diffusion of copper into the dielectric layer 214. In embodiments, the via barrier layer 222 is comprised of MnSiO3. In other embodiments, the via barrier layer 222 is comprised of tantalum nitride (TaN). Other materials are possible for via barrier layer 222. The via barrier layer 222 may be deposited via atomic layer deposition (ALD), physical vapor deposition (PVD), or other suitable method. Then the via cavity is filled with copper to form via 218. Metal deposition may then continue with formation of an M(x+1) metallization line 220. Alternatively, a single damascene process may be used to form the via, such as illustrated in FIG. 1i.

As can now be appreciated, embodiments of the present invention provide increased spacing between a via and neighboring metal lines. The self-forming barrier continues from the trench sidewall and on to the shoulder regions of the dielectric that is disposed between the lines. Due to the curvature of the shoulder regions, the distance between vias and neighboring metal lines is increased. The longer path results in a decreased electric field, which allows for the same voltages to be used at reduced dimensions, and serves to reduce the probability of time-dependent dielectric breakdown (TDDB).

FIG. 3 is a flowchart 300 indicating process steps for embodiments of the present invention. In process step 350, trenches are formed in a dielectric layer (see FIG. 1A). In process step 352, a copper alloy seed layer is deposited (see 106 of FIG. 1B). In embodiments, the copper alloy seed layer may comprise a copper-manganese alloy. In process step 354, a copper layer is deposited (see 108 of FIG. 1C). The copper layer may be deposited by an electroplating process. In process step 356, an anneal is performed. This causes a self-forming barrier layer to form along the dielectric layer (see 110 of FIG. 1D). In the case of a copper-manganese seed layer, the manganese (Mn) migrates to the dielectric surface (at an elevated process temperature of the anneal) and forms an MnSiO3 film, which is a dielectric film. In process step 358, a recess is performed. This may include a CMP over-polish, and/or a wet etch, such as a SC-1 (ammonium hydroxide and/or hydrogen peroxide) or an alanine wet etch.

In process step 359, an additional dielectric layer is formed (see 114 of FIG. 1F), and a recess is formed to create a via cavity (see 116 of FIG. 1G). In process step 360, a capping layer is deposited on the metallization lines. This may include depositing a blanket capping layer (see 112 of FIG. 1F), or a copper-selective capping layer (see 213 of FIG. 2B). In process step 362, a via opening is formed in the upper dielectric layer and the underlying M(x) metallization line is exposed (see 116 of FIG. 1H). In process step 364, a via barrier layer is formed (see 112 of FIG. 1i). The via barrier layer serves as a liner to prevent copper diffusion into the dielectric layers. In process step 366, the via is filled with copper, such as a by a single damascene process, (see 118 of FIG. 1i). From this point forward, industry-standard techniques may be used to complete the fabrication of the integrated circuit (IC). These steps may include additional back-end-of-line (BEOL) layer formation, followed by packaging and test.

FIG. 4 is a flowchart 400 indicating process steps for alternative embodiments of the present invention. In process step 450, trenches are formed in a dielectric layer (see FIG. 1A). In process step 452, trenches are filled with a copper alloy using a reflow process, without a plating operation. In embodiments, this process step may start with a conformal CVD cobalt or ruthenium film. Then, a Physical Vapor Deposition (PVD) process may be used to deposit Cu with the Mn (or other dopant), followed by a Cu reflow process. One way to achieve Cu reflow is by controlling the wafer process temperature (in some embodiments, keeping the wafer process temperature in the range of about 200 degrees Celsius to about 400 degrees Celsius) and argon ion bombardment which results in bottom-up fill for the smaller features without using plating. The thermal budget of this process may be adequate to drive the Mn to the dielectric interface, but an additional anneal may be used if necessary to complete the Mn diffusion. In process step 456, an anneal is performed. In process step 458, a recess is performed. This may include a CMP over-polish, and/or a wet etch, such as a SC-1 (ammonium hydroxide and/or hydrogen peroxide) or an alanine wet etch. In process step 459, an additional dielectric layer is formed (see 214 of FIG. 2A), and a recess is formed to create a via cavity (see 216 of FIG. 2B).

In process step 460, a capping layer is deposited on the metallization lines. This may include depositing a blanket capping layer (see 112 of FIG. 1F), or a copper-selective capping layer (see 213 of FIG. 2B). In process step 462, a via opening is formed in the upper dielectric layer and the underlying M(x) metallization line is exposed (see 116 of FIG. 1H). In process step 464, a via barrier layer is formed (see 112 of FIG. 1i). The via barrier layer serves as a liner to prevent copper diffusion into the dielectric layers. In process step 466, the via is filled with copper (see 118 of FIG. 1i). From this point forward, industry-standard techniques may be used to complete the fabrication of the integrated circuit (IC). These steps may include additional back-end-of-line (BEOL) layer formation, followed by packaging and test.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:

forming a plurality of M(x) trenches in a first dielectric layer thereby creating a shoulder region on a top surface of the first dielectric layer;

forming a manganese copper alloy seed layer on the first dielectric layer;

filling the plurality of M(x) trenches with copper to form a plurality of M(x) copper regions;

annealing the plurality of M(x) copper regions to form a manganese silicate liner between the first dielectric layer and the M(x) copper regions;

recessing the plurality of M(x) copper regions to a level below a top surface of the first dielectric layer, thereby leaving the manganese silicate liner on the top surface of the first dielectric layer and forming a plurality recessed M(x) copper regions;

forming a blanket capping layer over the manganese silicate liner on the top surface of the first dielectric layer and the plurality of recessed M(x) copper regions;

forming a second dielectric layer over the blanket capping layer;

forming an opening in the second dielectric layer and the blanket capping layer to expose one of the plurality of M(x) copper regions and an adjacent portion of the manganese silicate liner on the top surface of the first dielectric layer; and filling the opening in the second dielectric layer with metallurgy to form a via, wherein the via has a non-planar bottom surface comprising a lower portion and an upper portion, wherein the lower portion of the non-planar bottom surface of the via in electrical contact with the one of the plurality of M(x) copper regions previously exposed, and wherein an upper portion of the non-planar bottom surface of the via is in contact with the manganese silicate liner on the first dielectric layer.

2. The method of claim 1 wherein the upper portion is wider than the lower portion.

3. The method of claim 1, further comprising: prior to filling the plurality of M(x) trenches, forming a second liner layer comprising cobalt or ruthenium.

4. The method of claim 1, wherein annealing occurs at a process temperature ranging from about 100 degrees Celsius to about 450 degrees Celsius for a duration ranging from about 1 minute to about 60 minutes.

5. The method of claim 1, wherein recessing the plurality of M(x) copper regions to a level below a top surface of the first dielectric layer comprises performing an over-polish operation with a chemical mechanical polish tool.

6. The method of claim 5, wherein recessing the plurality of M(x) copper regions to a level below a top surface of the first dielectric layer further comprises a wet etch process.

7. The method of claim 1, wherein recessing the plurality of M(x) copper regions to a level below a top surface of the first dielectric layer comprises recessing the plurality of M(x) copper regions to a level ranging from about 10 nanometers to about 30 nanometers below the top surface of the first dielectric layer.

8. The method of claim 3, recessing the plurality of M(x) copper regions to a level below a top surface of the first dielectric layer comprises removing a portion of the second liner layer to leave a portion the manganese silicate layer exposed on the shoulder region of the first dielectric layer.

9. The method of claim 1, wherein forming a blanket capping layer comprises forming a layer comprising at least two of silicon, nitrogen and carbon.

10. The method of claim 1, wherein forming metallurgy to form a via comprises forming a second manganese silicate liner on the second dielectric layer and filling the via with copper.

11. The method of claim 10 further comprising:

forming a third liner comprising cobalt or ruthenium between the second manganese silicate liner and the copper filling the via, wherein the third liner is in direct contact with the M(x) copper region and the copper filling the via.

\* \* \* \* \*